US010784140B2

(12) United States Patent
Salih et al.

(10) Patent No.: US 10,784,140 B2
(45) Date of Patent: Sep. 22, 2020

(54) ELECTRONIC DEVICE COMPRISING A DIE COMPRISING A HIGH ELECTRON MOBILITY TRANSISTOR

(71) Applicant: Semiconductor Components Industries, LLC, Phoenix, AZ (US)

(72) Inventors: Ali Salih, Mesa, AZ (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/664,758

(22) Filed: Oct. 25, 2019

(65) Prior Publication Data
US 2020/0066568 A1  Feb. 27, 2020

Related U.S. Application Data

(63) Continuation-in-part of application No. 15/225,607, filed on Aug. 1, 2016, now Pat. No. 10,497,602.

(51) Int. Cl.
*H01L 29/778* (2006.01)
*H01L 21/683* (2006.01)
(Continued)

(52) U.S. Cl.
CPC ........ *H01L 21/6835* (2013.01); *H01L 21/304* (2013.01); *H01L 21/306* (2013.01);
(Continued)

(58) Field of Classification Search
CPC .............. H01L 29/2003; H01L 29/404; H01L 29/7786; H01L 29/7816
(Continued)

(56) References Cited

U.S. PATENT DOCUMENTS 5,230,144 A    7/1993  Jun
6,448,168 B1   9/2002  Rao et al.
(Continued)

OTHER PUBLICATIONS

Bakir; "interconnect and Heterogeneous Microsystem Integration Technologies"; School of Electrical and Computer Engineering, Georgia Institute of Technology; slides 18 and 26 (2015).
(Continued)

*Primary Examiner* — Long K Tran
(74) *Attorney, Agent, or Firm* — Abel Schillinger, LLP

(57) ABSTRACT

An electronic device can include a semiconductor material and a semiconductor layer overlying the semiconductor material, wherein the semiconductor layer has a greater bandgap energy as compared to the semiconductor material. The electronic device can include a component having a high electrical field region and a low electrical field region. Within the high electrical field region, the semiconductor material is not present. In another embodiment, the component may not be present. In another aspect, a process can include providing a substrate and a semiconductor layer overlying the substrate; removing a first portion of the substrate to define a first trench; forming a first insulating layer within the first trench; removing a second portion of the substrate adjacent to first insulating layer to define second trench; and forming a second insulating layer within the second trench.

20 Claims, 12 Drawing Sheets

(51) Int. Cl.
| | |
|---|---|
| *H01L 27/06* | (2006.01) |
| *H01L 29/78* | (2006.01) |
| *H01L 27/085* | (2006.01) |
| *H01L 21/8258* | (2006.01) |
| *H01L 21/304* | (2006.01) |
| *H01L 21/306* | (2006.01) |
| *H01L 21/56* | (2006.01) |
| *H01L 23/31* | (2006.01) |
| *H01L 23/00* | (2006.01) |
| *H01L 29/40* | (2006.01) |
| *H01L 29/417* | (2006.01) |
| *H01L 29/16* | (2006.01) |
| *H01L 29/20* | (2006.01) |

(52) U.S. Cl.
CPC ........ *H01L 21/561* (2013.01); *H01L 21/6836* (2013.01); *H01L 21/8258* (2013.01); *H01L 23/3178* (2013.01); *H01L 23/3192* (2013.01); *H01L 24/95* (2013.01); *H01L 27/0694* (2013.01); *H01L 27/085* (2013.01); *H01L 29/404* (2013.01); *H01L 29/7786* (2013.01); *H01L 29/7816* (2013.01); *H01L 29/16* (2013.01); *H01L 29/20* (2013.01); *H01L 29/2003* (2013.01); *H01L 29/41766* (2013.01); *H01L 2221/6834* (2013.01); *H01L 2221/68327* (2013.01)

(58) Field of Classification Search
USPC .......................................... 257/778
See application file for complete search history.

(56) References Cited

U.S. PATENT DOCUMENTS

| | | |
|---|---|---|
| 6,621,136 B2 | 9/2003 | Grivna |
| 6,683,343 B2 | 1/2004 | Matsudai et al. |
| 6,818,525 B1 | 11/2004 | Durham et al. |
| 7,087,925 B2 | 8/2006 | Grivna |
| 7,253,477 B2 | 8/2007 | Loechelt et al. |
| 7,452,796 B2 | 11/2008 | Davies |
| 7,518,185 B2 | 4/2009 | Hadizad et al. |
| 7,579,632 B2 | 8/2009 | Salih et al. |
| 7,781,310 B2 | 8/2010 | Grivna |
| 7,842,969 B2 | 11/2010 | Marreiro et al. |
| 7,989,319 B2 | 8/2011 | Grivna et al. |
| 8,012,857 B2 | 9/2011 | Grivna et al. |
| 8,384,231 B2 | 2/2013 | Grivna et al. |
| 8,492,260 B2 | 7/2013 | Parsey, Jr. et al. |
| 8,859,396 B2 | 10/2014 | Grivna et al. |
| 8,981,533 B2 | 3/2015 | Grivna |
| 9,117,802 B2 | 8/2015 | Parsey, Jr. et al. |
| 9,142,665 B2 | 9/2015 | Hirler et al. |
| 9,391,135 B1 | 7/2016 | Grivna et al. |
| 9,583,165 B1 | 2/2017 | Kim et al. |
| 2002/0030225 A1 | 3/2002 | Nakamura et al. |
| 2002/0137264 A1 | 9/2002 | Kao et al. |
| 2003/0062588 A1 | 4/2003 | Grivna |
| 2005/0176192 A1 | 8/2005 | Hshieh |
| 2006/0289894 A1 | 12/2006 | Murata et al. |
| 2008/0296675 A1 | 12/2008 | Yanagida |
| 2011/0140228 A1 | 6/2011 | Wang et al. |
| 2012/0187527 A1 | 7/2012 | Guitart et al. |
| 2013/0277807 A1 | 10/2013 | Parsey, Jr. et al. |
| 2014/0061659 A1* | 3/2014 | Teplik ................... H01L 29/402 257/76 |
| 2014/0070375 A1 | 3/2014 | Grivna |
| 2014/0264452 A1* | 9/2014 | Salih ................. H01L 23/53242 257/194 |
| 2015/0061020 A1 | 3/2015 | Yokoyama et al. |
| 2015/0235866 A1 | 8/2015 | Nakamura |
| 2015/0357437 A1 | 12/2015 | Vellei |
| 2015/0380247 A1 | 12/2015 | Horii et al. |
| 2016/0172464 A1 | 6/2016 | Grivna |
| 2017/0294630 A1* | 10/2017 | Hero ................... H01L 27/3239 |

OTHER PUBLICATIONS

Thadesar et al.; "Low-Loss Silicon Interposer for Three-Dimensional System Integration with Embedded Microfluidic Cooling"; IEEE; 2014 Symposium on VLSI Technology Digest of Technical Paper; pp. 156-157.

Yang; "Through-Silicon-Via Inductor: Is it Real of Just a Fantasy?"; Masters Thesis, Missouri University of Science and Technology; pp. 1-45 (2013).

Vanackern; "On-Chip 3D Inductors Using Thru-Wafer Vias"; College of Engineering, Boise State University; 2012, p. 20.

Chung et al.; "GaN-on-Si technology, a new approach for advanced devices in energy and communications"; Proceedings of the European Solid-State Device Research Conference 2010 (ESSDERC); pp. 52-56.

Chung et al.; "Seamless On-Wafer Integration of Si(100) MOSFETs and GaN HEMTs"; IEEE Electron Device Letters; vol. 30, No. 10; Oct. 2009, pp. 1015-1017.

Motto; "Application Characteristics of an Experimental RB-IGBT (Reverse Blocking IBGT) Module"; IEEE; 0-7803-8480-03; pp. 1-5 (2004).

Jiang; "Fabrication of Thick Silicon Dioxide Sacrificial and Isolation Blocks in a Silicon Substrate"; Journal of Micromechanics and Microengineering, 12, (2002), pp. 87-95.

Lindemann; "A New IGBT with Reverse Blocking Capability"; Entwurf fur EPE Conference, Graz; IXAN0049; pp. 1-7 (2001).

* cited by examiner

ELECTRONIC DEVICE COMPRISING A DIE COMPRISING A HIGH ELECTRON MOBILITY TRANSISTOR

CROSS-REFERENCE TO RELATED APPLICATIONS

This application is a divisional of and claims priority under 35 U.S.C. § 120 to U.S. patent application Ser. No. 15/225,607 entitled "Electronic Device and a Process for Forming the Same" by Ali Salih and Gordon M. Grivna, filed Aug. 1, 2016, which is assigned to the current assignee hereof and incorporated herein by reference in its entirety.

FIELD OF THE DISCLOSURE

The present disclosure relates to electronic devices and processes of forming electronic devices.

RELATED ART

Compound semiconductor materials are being used for power applications. Electronic components using such compound semiconductor materials can operate at higher voltages as compared to silicon because of higher bandgap energies. Many of the compound semiconductor materials are formed over a silicon substrate. High electrical fields can cause premature voltage breakdown due to the presence of the silicon. Another attempt at addressing the problem has been to use wafer-wafer bonding with insulating materials. Wafer-wafer bonding can involve very high temperatures that require its use relatively early in the fabrication. Improve breakdown voltage without unnecessary process restrictions or other limitations are desired.

BRIEF DESCRIPTION OF THE DRAWINGS

Embodiments are illustrated by way of example and are not limited in the accompanying figures.

Figure 1:
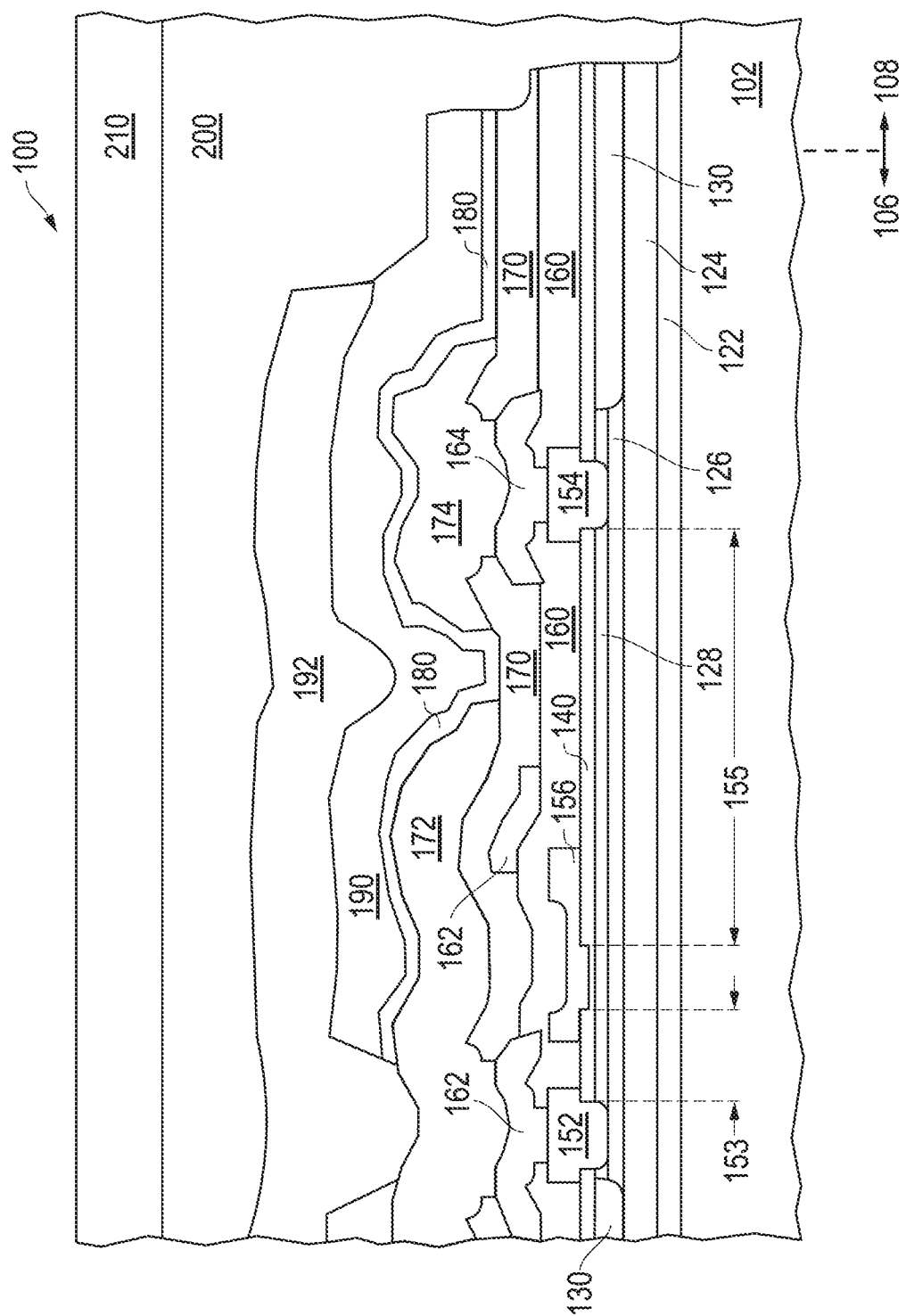
FIG. 1 includes an illustration of a cross-sectional view of a portion of a workpiece after forming a component and a planarization layer and after placing a tape over the planarization layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention. To the extent terms defined below differ from those in U.S. Pat. No. 8,492,260, the terms as defined below govern in this document.

The term "electronic component" is intended to mean a component that is or can readily be made part of a circuit. An example of an electronic component includes an active component or a passive component, such as a capacitor, resistor, diode, or the like. An electronic component does not include an interconnect, conductive plug, a via, or the like whose function is to electrically connect at least two electronic components or an electronic component and a terminal to each other. The two electronic components or the combination of the electronic component may be on the same substrate or workpiece or on different substrates or workpieces.

The term "substantially fills" when referring to a material being formed within an opening or a trench, is intended to mean that most of the opening or trench, or most of a remainder of the opening or trench (if a liner, barrier, or other relatively-thin layer has been previously formed) is filled by the material. Note that a void may be formed when substantially filling the opening or trench with the material. The term "substantially completely fills" is intended to mean that substantially all of the opening or trench or substantially all of the remainder of the opening or trench is filled with the material without a significant number of voids formed within the opening or trench.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

In an aspect, an electronic device can include a first semiconductor material having a first bandgap energy; a semiconductor layer overlying the first semiconductor material, wherein the semiconductor layer includes a second semiconductor material having a second bandgap energy that is greater than the first bandgap energy; and an electronic component within the second semiconductor layer, wherein the first electronic device includes a high electrical field region and a low electrical field region. Within the high electrical field region, the first semiconductor material is not present.

In another aspect, a process can be used to form an electronic device. The process can include providing a substrate and a semiconductor layer overlying the substrate; forming an electronic component within the semiconductor layer; removing a first portion of the substrate to define a first trench; forming a first insulating layer within the first trench; removing a second portion of the substrate within the active area adjacent to first insulating layer to define second trench; and forming a second insulating layer within the second trench.

In a further aspect, a process can be used to form an electronic device. The process can include providing a substrate and a semiconductor layer overlying the substrate, wherein the semiconductor layer has a first major surface and a second major surface opposite the first major surface; forming a first electronic component along the first major surface of the semiconductor layer; removing a portion of the substrate under the first electronic component; and forming second electronic component adjacent to the semiconductor layer after removing the portion of the substrate.

Embodiments described herein can also help to reduce the likelihood of breakdown of a transistor via the substrate, where the transistor operates at a high voltage and includes a semiconductor material having a relatively larger bandgap energy, and the substrate includes a different semiconductor material having a relatively smaller bandgap energy.

A process described below allows relatively two sequence operation to remove significant portion of the substrate during the first sequence where the remaining portion of the substrate to provide sufficient mechanical support, and remove another significant portion of the substrate during the second sequence where a fill material and, if any, the remaining portion of the substrate to provide sufficient mechanical support. The process can be selective in that not all of the substrate must be removed, such as would occur with a wafer-wafer bonding process. The process as described herein also can be easier to implement, as the pressures and temperatures seen with wafer-wafer bonding are not required, and removal of the handle substrate (in wafer-wafer bonding) is obviated.

Further, backside processing allows more options to designers and fabricators of the electronic devices, as backside components and interconnects can be formed relatively later in the process when maximum thermal budgets may be limited due to frontside components may have already been formed. Still further, the selection of backside components may be deferred until later in the fabrication process. Thus, after the frontside components are formed, a decision can be made whether to form another component for a cascade circuit, a gate driver or control circuit, or a bridge (half or full) is to be formed. The concepts are better understood after reading the description below in conjunction with the accompanying figures that provide exemplary, non-limiting embodiments.

FIG. 1 includes an illustration of a cross-sectional view of a portion of a workpiece 100 after front-side processing of the workpiece 100 has been completed. The workpiece 100 includes a substrate 102 including a semiconductor material having a bandgap energy. A nucleation layer 122, a buffer layer 124, a channel layer 126, and a barrier layer 128 overlie the substrate 102. Any one or more of the layers 122, 124, 126, and 128 can be a semiconductor layer that includes a semiconductor material having a bandgap energy greater than the bandgap energy of the semiconductor material of the substrate. In an embodiment, the semiconductor material of the substrate 102 can include a monocrystalline Group 14 element (e.g., silicon or germanium), a III-V semiconductor material, or a II-VI semiconductor material. The semiconductor material of any one or more of the layers 122, 124, 126, and 128 can include a compound semiconductor material. The compound semiconductor material can include SiC, a III-V compound, or a II-V compound). The III-V compound can include III-N, III-P, III-As, and the III element may be selected from Al, Ga, In, or any combination thereof. The II-VI compound can include II-O, II-S, II-Se, or II-Te, and the II element can include Zn, Cd, Hg, Pb, or the like.

The substrate 102 can have an initial thickness of at most approximately 2000 microns, and in another embodiment, the initial thickness is at most approximately 900 microns. In a further embodiment, the initial thickness is at least approximately 110 microns, and in another further embodiment, the initial thickness is at least approximately 150 microns. In a particular embodiment, the initial thickness is in a range of approximately 600 to approximately 800 microns.

In an embodiment, the substrate 102 can include a semiconductor material having a bandgap energy less than 1.5 eV at room temperature (e.g., 22° C.), and any one or more of the layers 122, 124, 126, and 128 can include a different semiconductor material having a bandgap energy greater than 1.5 eV at room temperature. In another embodiment, the substrate 102 can include Si, Ge, or GaAs, and any one or more of the layers 122, 124, 126, and 128 can include $Al_xGa_{(1-x)}N$, where $0 \leq x \leq 1$. In a more particular embodiment, the substrate 102 can be a Si substrate, such as in wafer form, the nucleation layer 122 includes AlN, the buffer layer 124 includes $Al_yGa_{(1-y)}N$, where $0 \leq y < 1$, where y decreases as distance from the nucleation layer 122 increases, the channel layer 126 includes GaN, and the barrier layer 128 includes $Al_zGa_{(1-z)}N$, where $0<z\leq0.3$. The substrate 102 and any one or more of the layers 122, 124, 126, and 128 may or may not be doped. Isolation regions 130 help to isolate the transistor structure as illustrated from other transistor structures that may be present within the same die. The isolation regions 130 can be formed by implanting nitrogen ions.

A dielectric layer 140 can include one or more dielectric films 140. The dielectric layer 140 is etched to define openings, and source and drain electrodes 152 and 154 are formed. The openings for the source and drain electrodes 152 and 154 may extend to an upper surface of the barrier layer 128, partly through the barrier layer 128, or completely through the barrier layer 128, as illustrated in FIG. 1. An opening is formed partly or completely through the dielectric layer 140, and a gate electrode 156 is formed within the opening. The transistor structure illustrated is a high electron mobility transistor (HEMT), and the HEMT may be a depletion-mode HEMT or an enhancement-mode HEMT. After reading this specification, skilled artisans will be able to determine the relationship between the gate electrode 156 and the opening through at least part of the dielectric layer 140 to achieve a depletion-mode or an enhancement-mode HEMT. The portions of the electrodes 152, 154, and 156 that extend beyond the openings of the dielectric layer 140 can be field plates that help to reduce gate-to-drain capacitance and gate-to-source capacitance. The electrical fields associated with the portions of the HEMT between the drain electrode 154 and the gate electrode 156 (designated by region 155) and between the source electrode 152 and gate electrode 156 (designated by region 153) will be addressed later in this specification.

An interlevel dielectric (ILD) layer 160 is formed over the dielectric layer 140 and the electrodes 152, 154, and 156. The ILD layer 160 can include one or more insulating films. The ILD layer 160 is etched to define openings, and interconnects 162 and 164 are formed. Similar to the electrodes 152, 154, and 156, portions of the interconnects 162 and 164 that extend in lateral directions outside the openings can be field plates that help to reduce capacitive coupling within the HEMT. The two portions of the interconnect 162 that are illustrated in FIG. 1 are connected to each other at a location not illustrated and define an opening over the gate electrode 156. The opening within the interconnect 162 helps to reduce gate-to-source capacitance. Another ILD layer 170 is formed over the ILD layer 160 and the interconnects 162 and 164. The ILD layer 170 can include one or more insulating films and can have the same composition or a different composition as compared to the ILD layer 160. The ILD layer 170 is etched to define openings, and interconnects 172 and 174 are formed. Similar to the electrodes 162, and 164, portions of the interconnects 172 and 174 that extend in lateral directions outside the openings can be field plates that help to reduce capacitive coupling within the HEMT.

A passivation layer 180 overlies the ILD layer 170 and the interconnects 172 and 174. The passivation layer 180 includes a nitride or oxynitride and is a moisture barrier for the electronic device. An insulating layer 190 is formed over the passivation layer 180, and the layers 180 and 190 are etched to define an opening, and a source bonding electrode 192 is formed within the opening and extending over a portion of the HEMT. Wire bonds, clips or other connections can be made to the bonding layer 192. Other interconnects and bonding electrodes are formed and electrically connected to the drain electrode 154 and the gate electrode 156 but are not illustrated in FIG. 1. The HEMT is within a component region 106 of the electronic device. A peripheral region 108 of the electronic device is part of a lattice of the workpiece that provides mechanical support as described later in this specification.

The front side of the workpiece, which includes the HEMT, has a topography that varies significantly across the workpiece. A planarizing layer 200 helps to make the frontside workpiece to be flat when backside processing occurs. In an embodiment, the planarizing layer 200 can be a polymer that can be coated and can include a nitrogen-containing polymer or a polymer of an aromatic monomer. The planarizing layer 200 can include a polybenzoxazole (PBO), a polyimide, a liquid crystal polymer, another suitable polymer, or any combination thereof. A tape 210 that can withstand the same temperatures as the planarizing layer 200 may be used. The tape 210 can help reduce damage to the frontside of the workpiece during backside processing. In a particular embodiment, the tape 210 can include any of the materials as previously described with respect to the planarization layer 200. The tape 210 can include the same or a different material as compared to the planarization layer 200. In a particular embodiment, the planarization layer 200 can include PBO, and the tape 210 can be Kapton™-brand tape, which includes a polyimide material. Although not illustrated in FIG. 1, the tape 210 may be significantly thicker than the planarization layer 200. The Kapton™-brand tape may also include a silicone-based adhesive so that the polyimide film will adhere to the planarization layer 200.

At this point in the process, the workpiece can be flipped over so that backside processing can begin. The semiconductor substrate 100 can be thinned. In an embodiment, the semiconductor substrate 100 can be thinned by backgrinding or etching the semiconductor substrate 102. The amount of thinning may be affected by mechanical support, electronic component dimensions, or a combination thereof. In an embodiment, the substrate 102 may be thinned such that the thickness after thinning is at least 15%, at least 20%, or at least 25% of the initial thickness of the substrate 102. In another embodiment, the substrate 102 may be thinned such that the thickness after thinning is at most 60%, at most 50%, or at most 40% of the initial thickness of the substrate 102. In terms of actual dimensions, in an embodiment, the substrate 102 may be thinned such that the thickness after thinning is at least 50 microns, at least 110 microns, or at least 150 microns. In another embodiment, the substrate 102 is thinned such that the thickness after thinning is at most 400 microns, at most 300 microns, or at most 200 microns.

Figure 2:
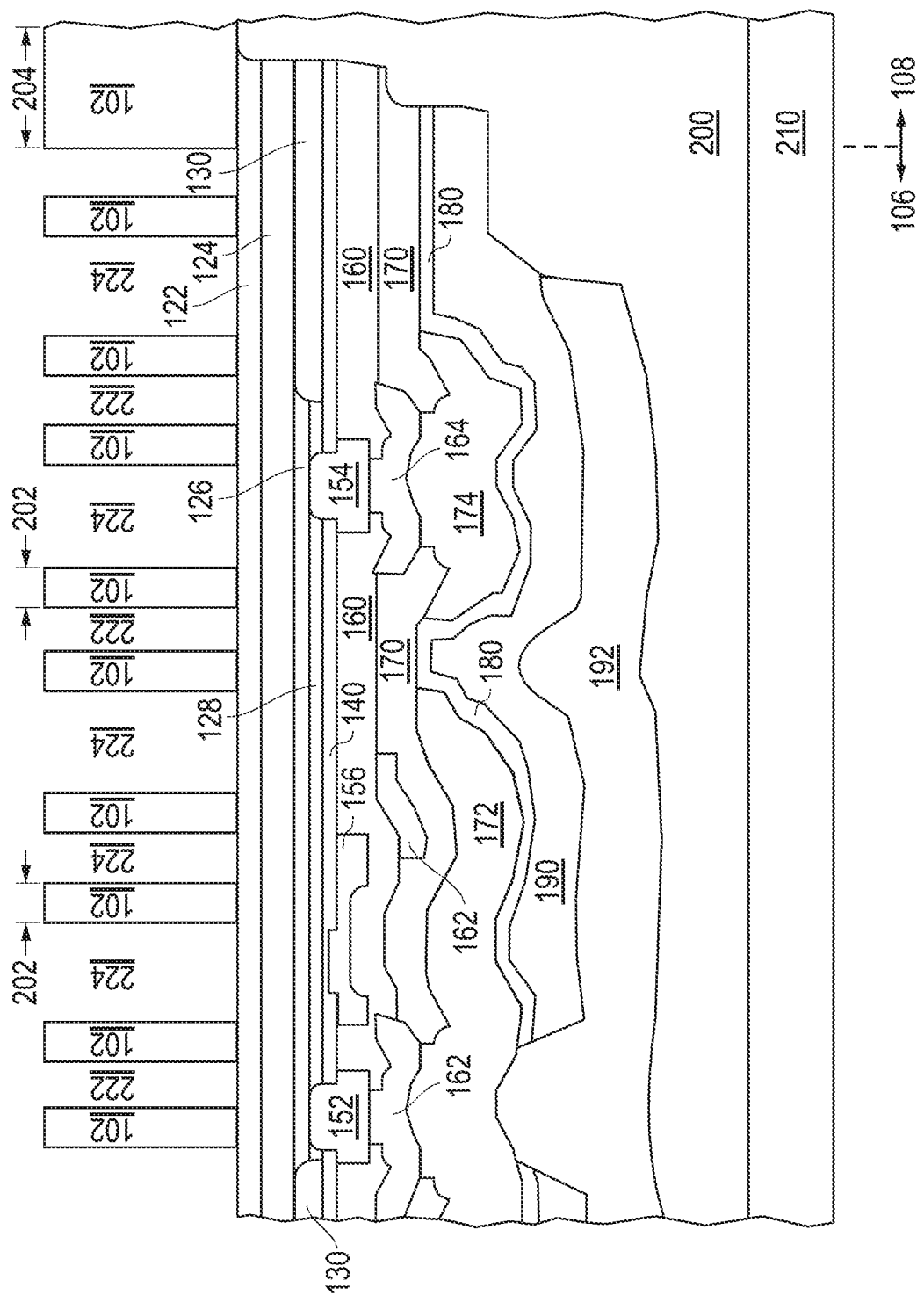
FIG. 2 includes an illustration of a cross-sectional view of the workpiece of FIG. 1 after removing a portion of the substrate.

After the substrate 102 is thinned, a mask (not illustrated) is formed over the substrate 102, and the substrate 102 is etched to define trenches 222 and 224 that extend to the nucleating layer 122, as illustrated in FIG. 2. After the etch, the mask can be removed. In the embodiment as illustrated, the trenches 222 are narrower than the trenches 224. In particular, the trenches 222 have a width such that voids will form when subsequently depositing an insulating layer within the trenches 222. The significance of the voids is addressed later in this specification.

In an embodiment, the widths of the trenches 222 are at most 1.0 microns, at most 2.0 microns, or at most 3.0 microns, and in another embodiment, the widths of the trenches 222 are at least 5.0 micron, at least 10.0 microns, or at least 15.0 microns. The trenches 224 may have a width such that the likelihood of forming a void when subsequently depositing an insulating layer within the trenches 224 is substantially reduced. In an embodiment, the widths of the trenches 224 are at most 1.2 microns, at most 2.2 microns, or at most 3.2 microns, and in another embodiment, the widths of the trenches 224 are at least 5.5 microns, at least 10.5 microns, or at least 15.5 microns.

Figure 3:
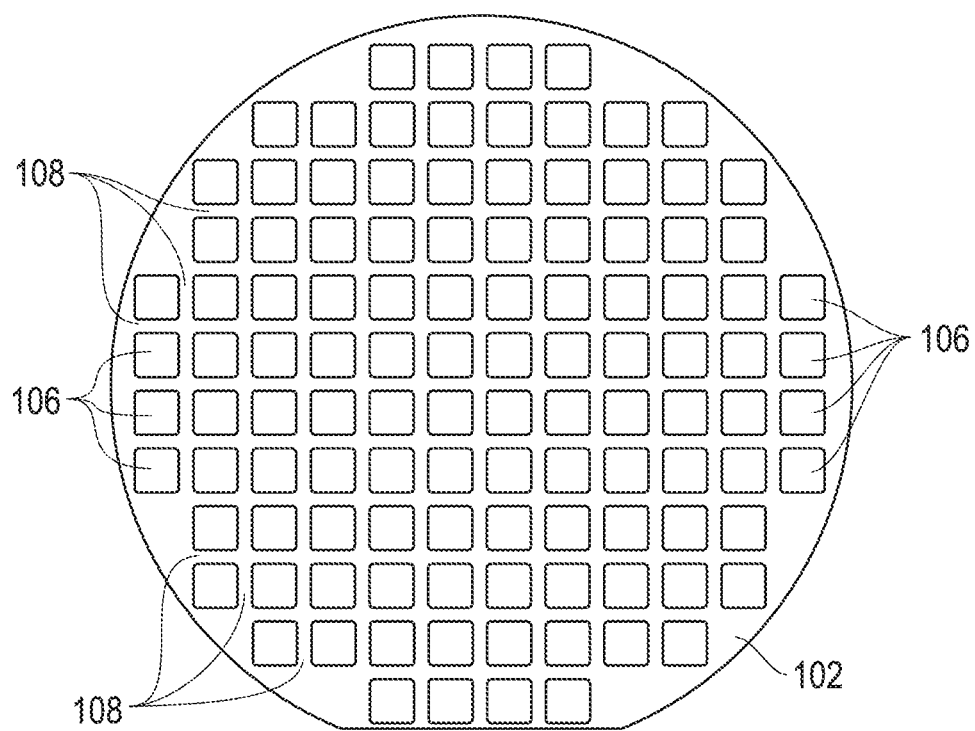
FIG. 3 includes an illustration of a view of a backside of the workpiece of FIG. 2 after removing the portion of the substrate.

The portions of the substrate 102 within the region 155, which are between the drain and gate electrodes 154 and 156, will be subsequently removed. The portions of the substrate 102 within the region 153, which are between the source and gate electrodes 152 and 156, may or may not be subsequently removed. FIG. 3 includes an illustration of the backside of the substrate 102 after removing the portions of the substrate 102 in FIG. 2. In this particular embodiment, the peripheral region 108 includes portions of the substrate 102 that form a lattice corresponding where scribe lanes are present on the frontside of the workpiece 102. Thus, good mechanical support can be achieved. When viewing the backside of the workpiece, portions of the substrate 102 within the component regions 106 are in the form of pillars that can have any of the shapes as described or illustrated in U.S. Pat. No. 8,492,260, which is incorporated by reference in its entirety. In a particular embodiment, the pillars can have an I-beam or modified I-beam shape, although the shapes cannot be individually seen in FIG. 3 due to their small dimensions.

In the embodiment as illustrated, the portions of the substrate 102 within the region 153 and elsewhere within each die, except at the peripheral portion of the die, will be removed. In an embodiment, the widths 202 are in a range of 1.0 micron to 15.0 microns. In another embodiment, the widths 202 may be outside the range previously recited.

Figure 4:
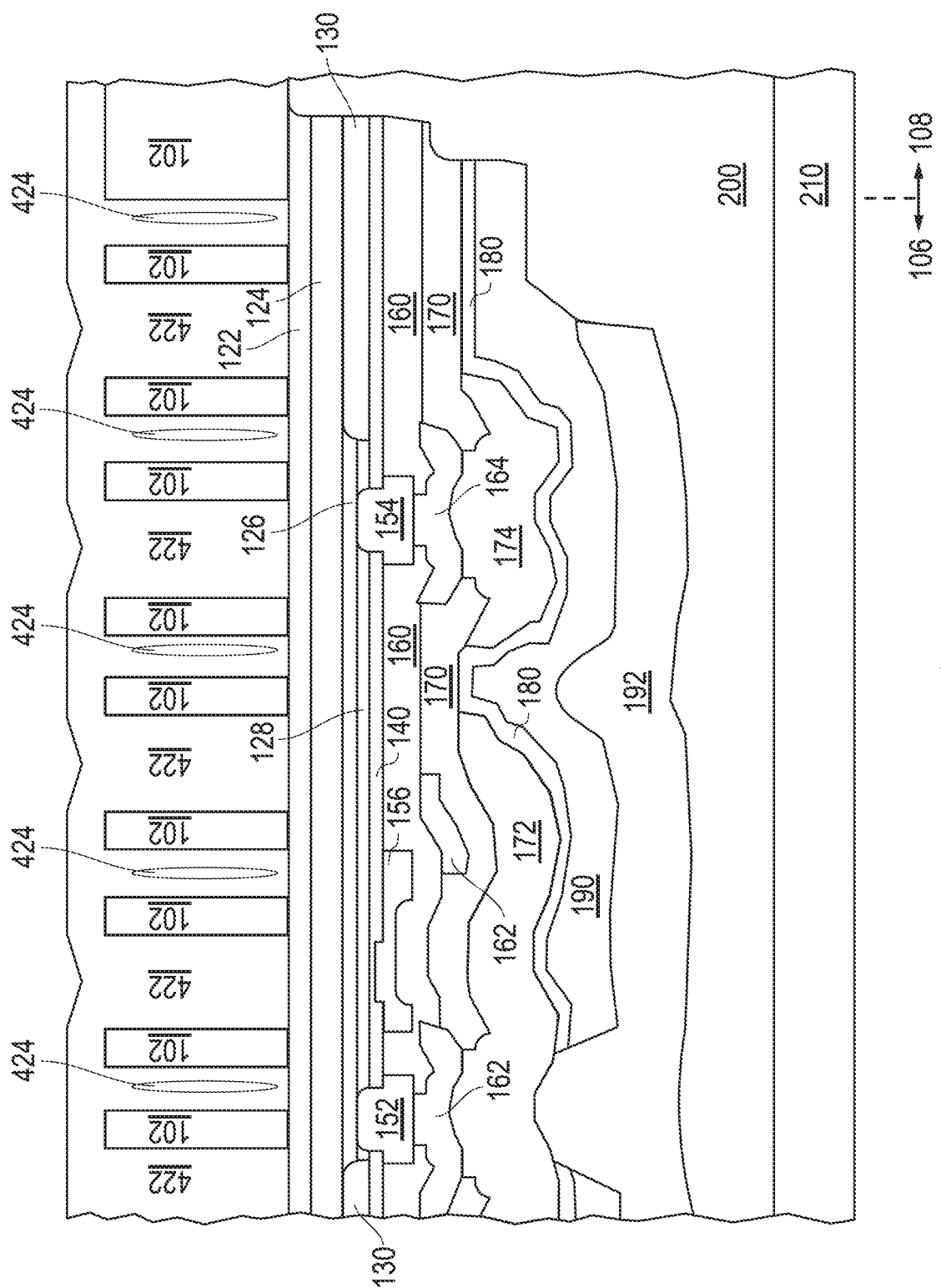
FIG. 4 includes an illustration of a cross-sectional view of the workpiece of FIG. 2 after forming an insulating layer within trenches extending into the substrate.

FIG. 4 includes an illustration of a cross-sectional view of the workpiece after forming an insulating layer 422. In the embodiment as illustrated, the insulating material 422 partially fills the trenches 222, completely fills the trenches 224, and overlies the portions of the substrate 102. Voids 424 are defined as the insulating layer 422 fills the trenches 222. The voids 424 help to dissipate stress and reduce the likelihood of fracturing or delamination of layers. Thus, the electronic devices being formed can have a greater likelihood to survive thermal cycles during subsequent processing or when the electronic devices are operating. The insulating layer 422 can include one or more films of an oxide, nitride, or an oxynitride. The insulating layer 422 can be formed by a deposition alone or by deposition and planarization technique (resist etchback or chemical-mechanical polishing) or formed using a dep-etch-dep process.

Figure 5:
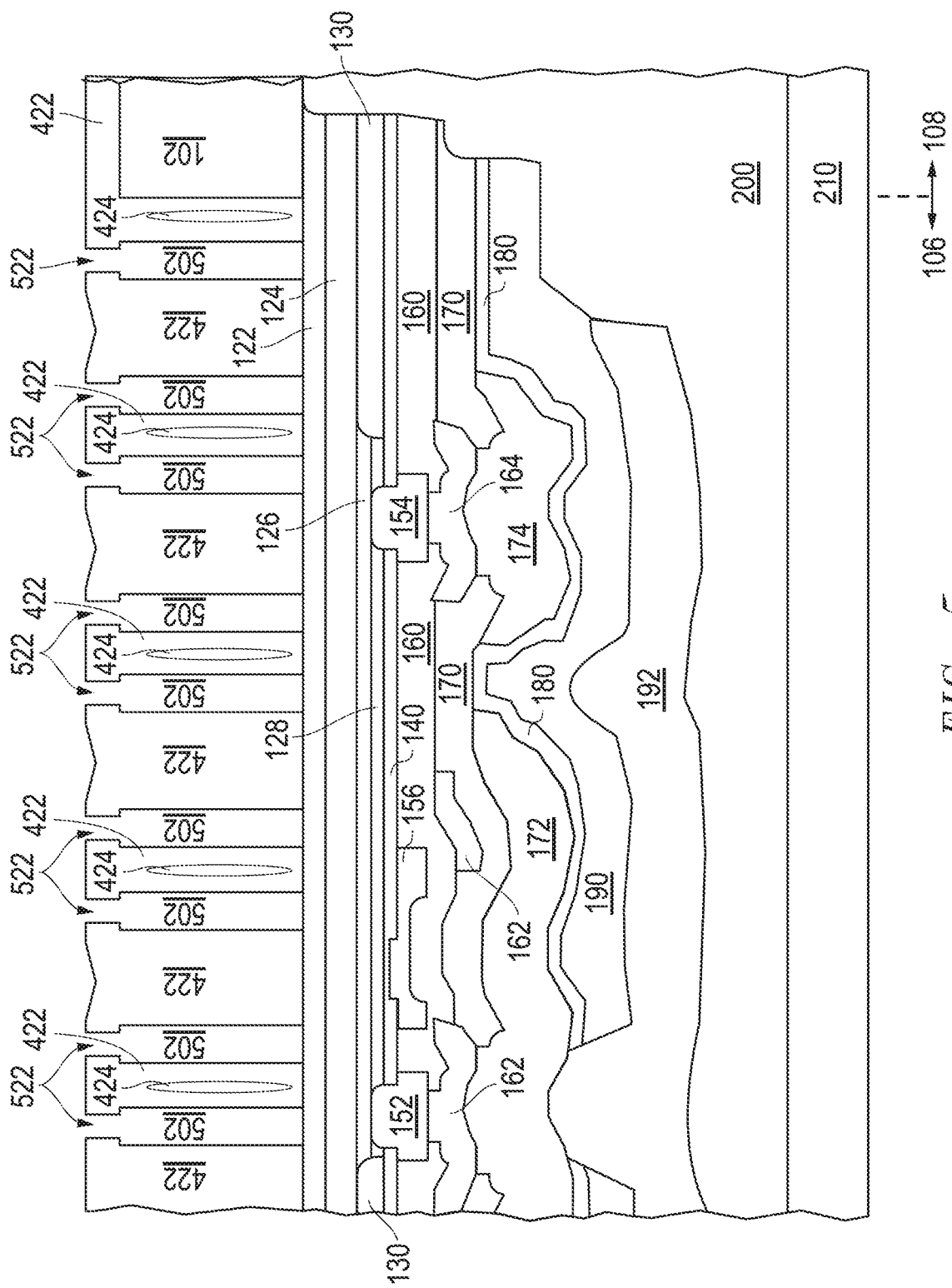
FIG. 5 includes an illustration of a cross-sectional view of the workpiece of FIG. 4 after removing another portion of the substrate.

A mask (not illustrated) is formed over the insulating layer 422, and the insulating layer 422 is etched to define openings 522 in FIG. 5. Referring to FIGS. 4 and 5, the openings 522 extend to portions of the substrate 102. In an embodiment, only some of the portions of the substrate 102 are exposed, and in another embodiment, each of the portions of the substrate 102 is exposed. After the etch of the insulating layer 422, exposed portions of the substrate 102 are removed to leave cavities 502 under the openings 522. In the embodiment, as illustrated in FIG. 5, the right-most portion of the substrate 102 remains, as such right-most portion can be within the periphery region of the electronic device, adjacent to a scribe line for a die, and into a scribe line for a die. The mask can be removed after defining the openings 522 and may be removed before or after the portions of the substrate 102 are removed to define the cavities 502.

Figure 6:
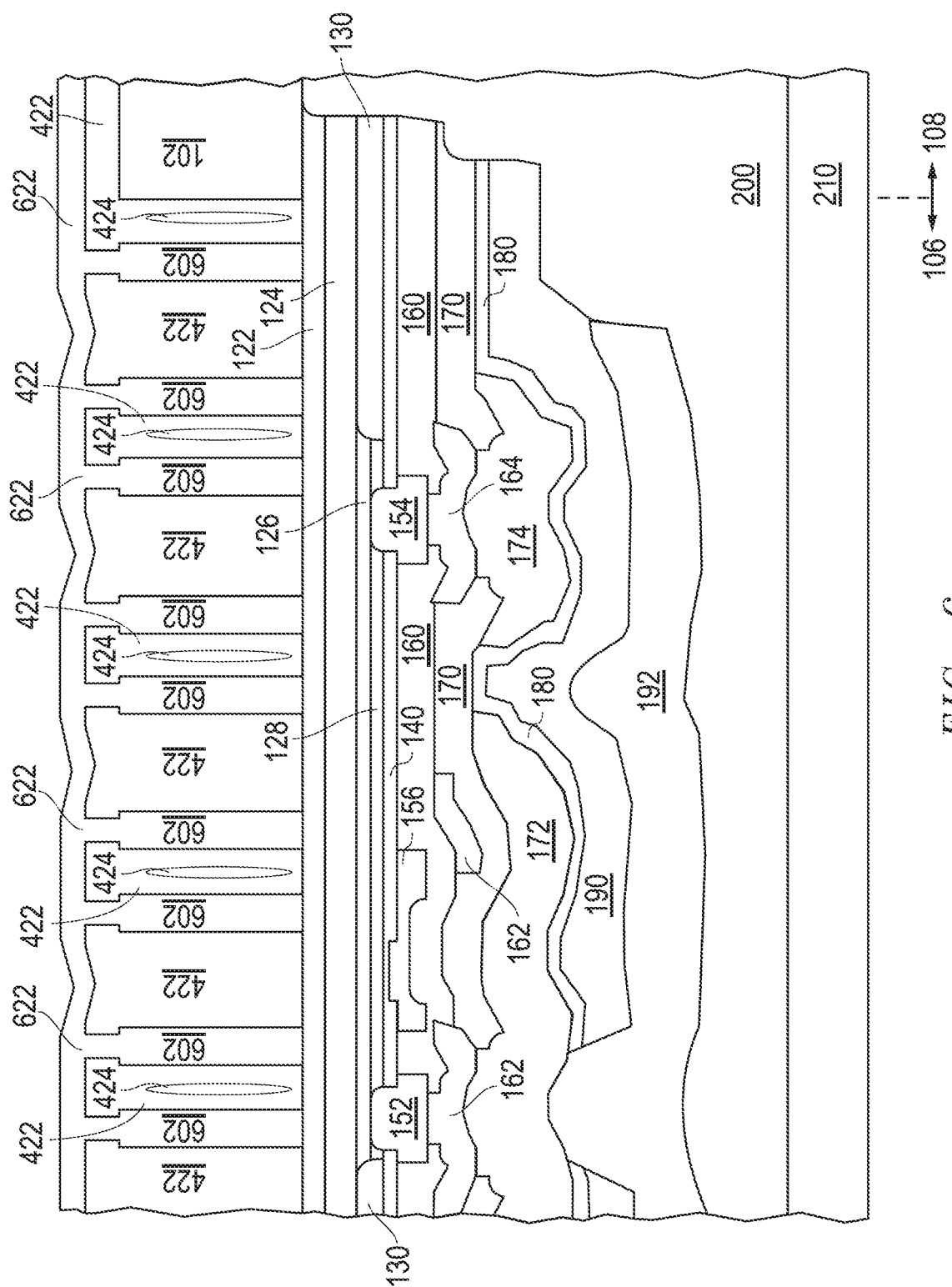
FIG. 6 includes an illustration of a cross-sectional view of the workpiece of FIG. 5 after forming another insulating layer.

FIG. 6 includes an illustration of the workpiece after forming an insulating layer 622. In the embodiment as illustrated, the insulating layer 622 includes cavity-filling portions 602, which correspond to regions where portions of the substrate 102 were removed to form the cavities 502 (FIG. 5). The portions 602 may completely fill the cavities 502, as illustrated in the embodiment of FIG. 6 or may partly fill the cavities 502 and include voids (not illustrated) that would be similar to the voids 424. The insulating layer 622 can include any of the materials or be formed using any of the techniques as previously described with respect to the insulating layer 422. The insulating layer 622 can include the same or different composition as compared to the insulating layer 422, and the insulating layer can be formed using the same or different technique as compared to the insulating layer 422.

Figure 7:
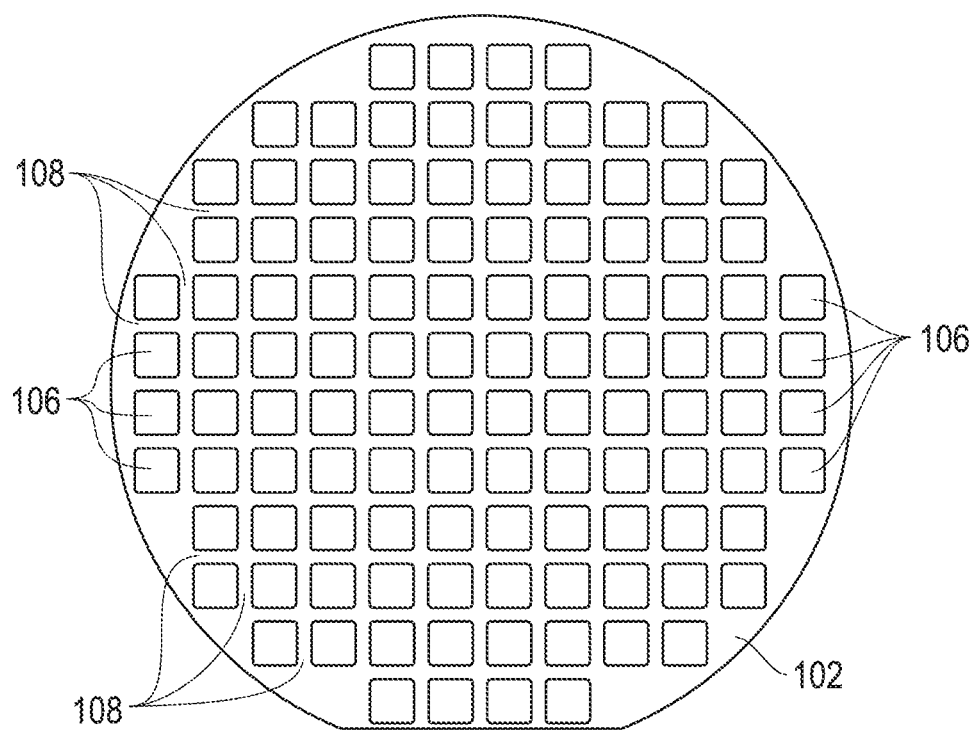
FIG. 7 includes an illustration of a view of a backside of the workpiece of FIG. 6 after removing the other insulating layer.

FIG. 7 illustrates the backside of the workpiece at this point in the processing. In the embodiment as illustrated, the only remaining portion of the substrate 102 is within the peripheral portion 108 that has a lattice corresponding to regions where scribe lanes are present on the frontside of the workpiece 102 and regions where no die are formed. The component regions 106 are filled with the insulating layers 422 and 622, as better seen in FIG. 6. Skilled artisans will understand the remaining portion of the substrate 102 in FIG. 7 is covered by the insulating layers 422 and 622 but such layers are not identified in FIG. 7 to aid in understanding the relationship between the portion of the substrate 102 that remains and the insulating layers 422 and 622 within the openings of the substrate 102. At this point in the process, the backside processing is completed for this particular embodiment.

Figure 8:
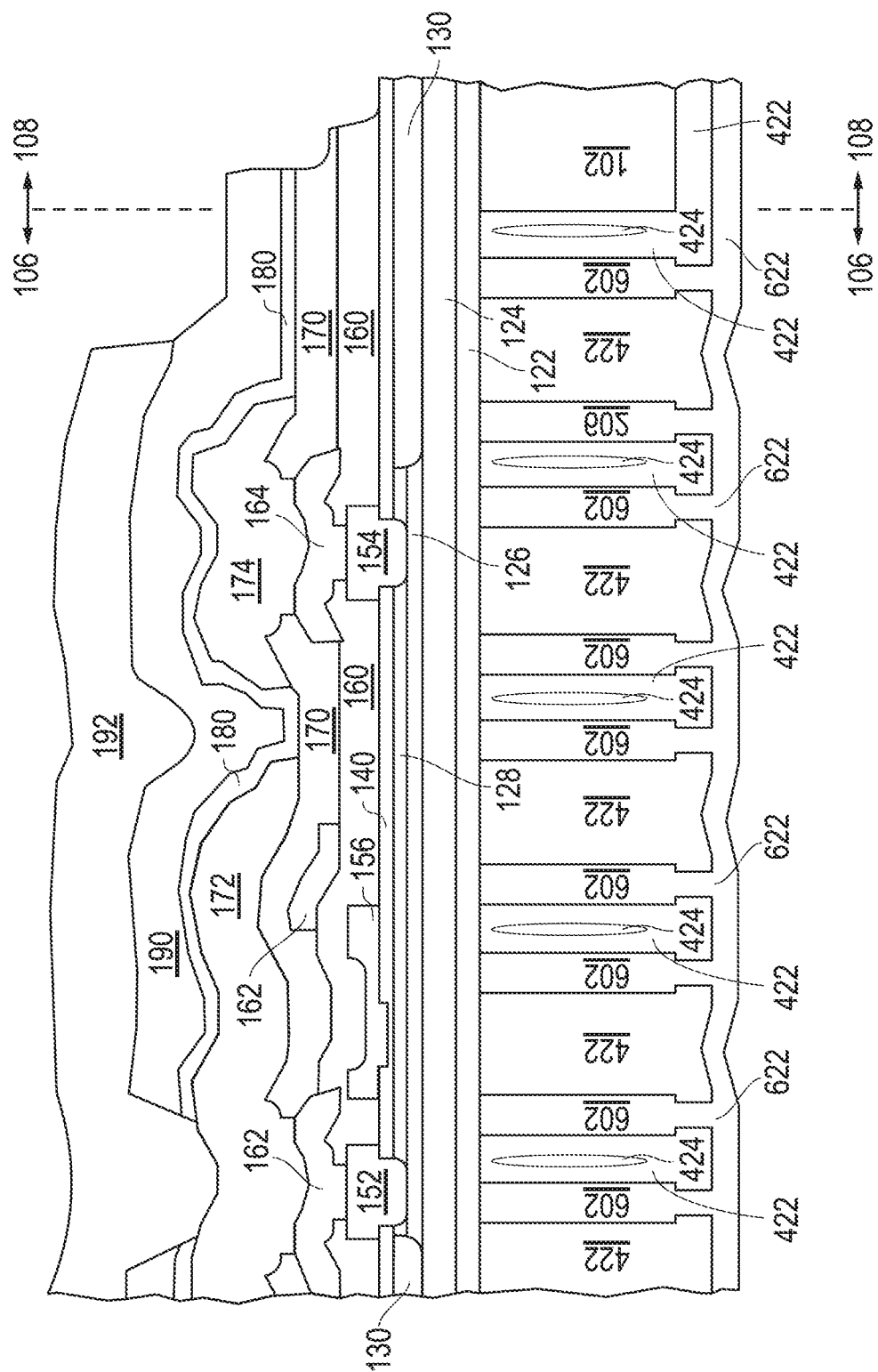
FIG. 8 includes an illustration of a cross-sectional view of the workpiece of FIG. 6 after forming a substantially complete electronic device.

FIG. 8 includes an illustration of a substantially completed electronic device. The tape 210 and planarization layer 200 are removed such that the source bonding electrode 192 and the insulating layer 190 are exposed. Other bonding electrodes for the gate and drain for the HEMT are also exposed but not illustrated in FIG. 8. Subsequently processing can include singulation of workpiece to form dies that can be bonded to packaging substrates or wire lead frames and encapsulated or otherwise assembled to form packaged electronic devices.

In a particular embodiment such as the embodiment illustrated in FIGS. 1 to 8, a portion of the substrate 102 can remain along the peripheral part of the die after singulation. In another embodiment, more of the substrate 102 may remain. For example, within the region 153 and to the left-hand side of the region 153, all or at least some of the substrate 102 may remain in the finished electronic device.

Figure 9:
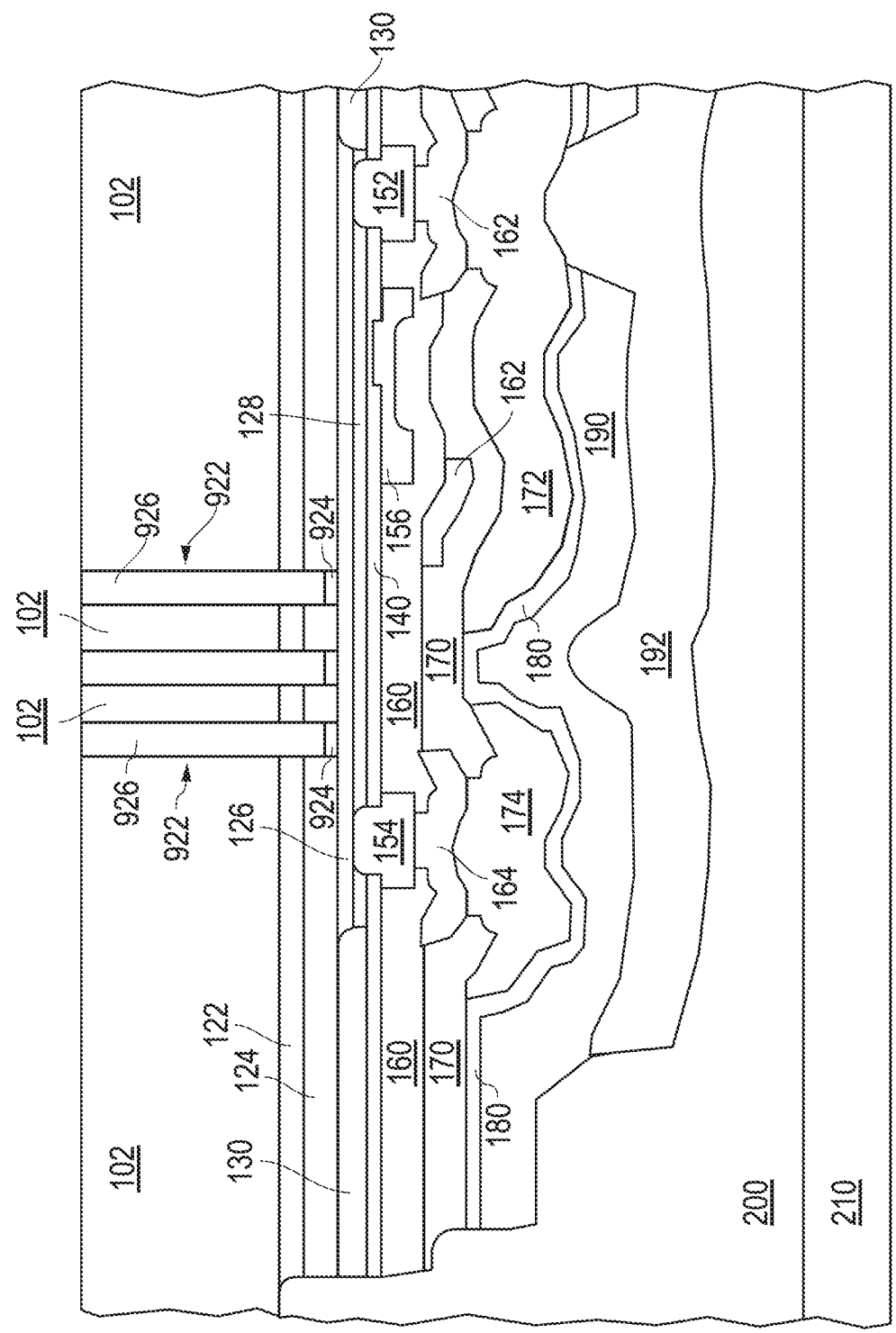
FIG. 9 includes an illustration of a cross-sectional view of a portion of a workpiece after forming interconnects along a backside of a semiconductor layer in accordance with an alternative embodiment.

In another embodiment, an interconnect or an electronic component may be formed along the backside of the workpiece. The electronic component can be include doping a portion of the backside, forming an interconnect, a transistor, a gate driver for a circuit, or the like. FIG. 9 includes an illustration of the workpiece after the substrate 102 has been thinned. Openings 922 can be formed though the substrate 102 and the nucleation layer 122, and the buffer layer 124 to expose the channel layer 126. Interconnects 924 can be formed within the openings 922. The interconnects 924 can be used to apply a backside bias to the channel layer 126 to help reduce electron trapping within the channel layer 126. In another embodiment (not illustrated), the openings 922 may not extend through the buffer layer 124, the interconnects 924 can be used to apply a backside bias to the buffer layer 124 to help reduce electron trapping within the channel layer 126. In another embodiment, the interconnects 924 may be used to route signals between the HEMT and other portions of the electronic device. The openings 922 can be filled with an insulating layer 926, and processing can continue as illustrated and described starting with FIG. 2. Subsequent patterning of the substrate 102 and formation of the insulating layers along the backside of the substrate 102 as described and illustrated in FIGS. 2 to 8 would not remove the interconnects 924.

Figure 10:
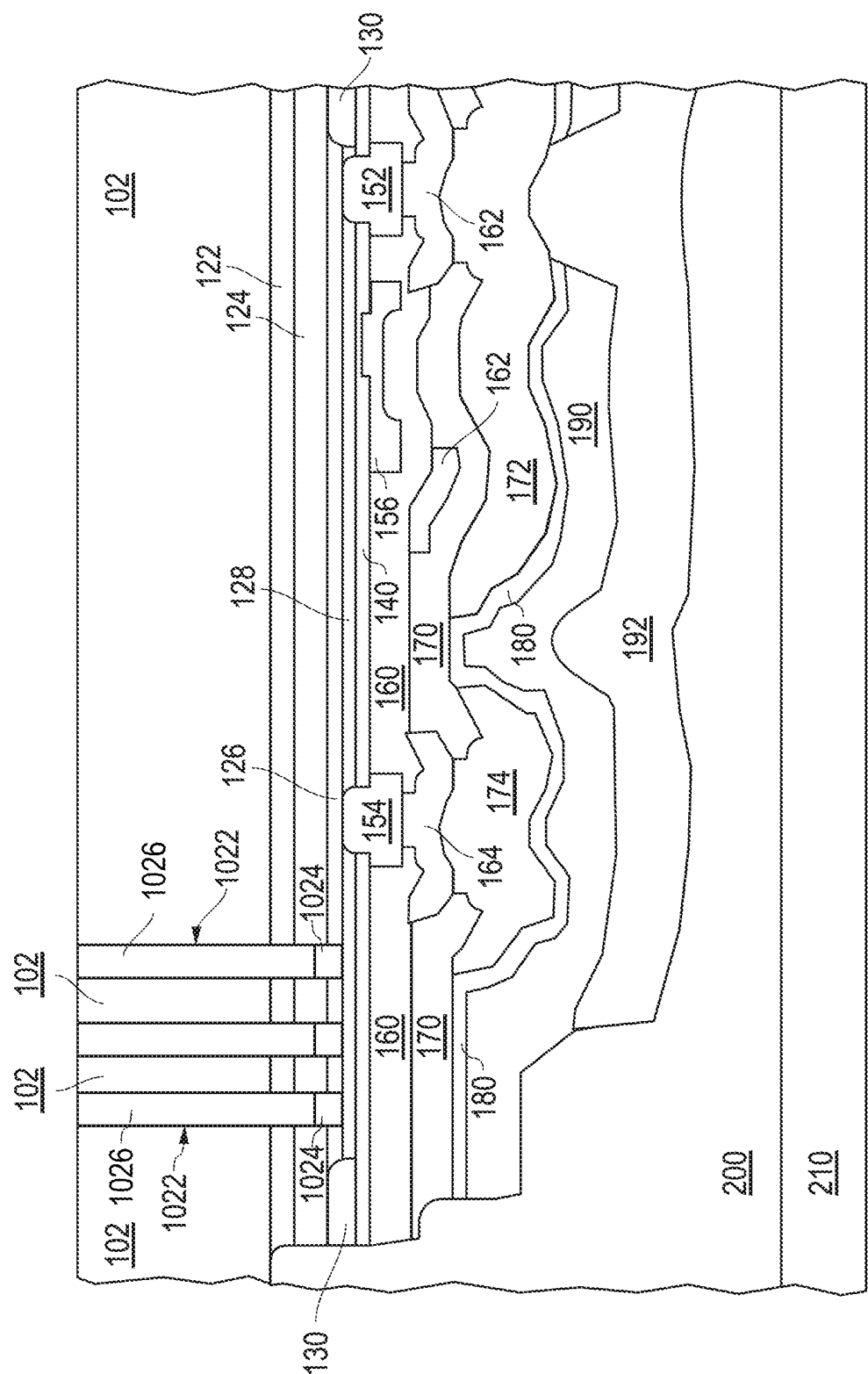
FIG. 10 includes an illustration of a cross-sectional view of a portion of a workpiece after forming doped regions along a backside of a semiconductor layer in accordance with another alternative embodiment.

FIG. 10 includes an illustration of the workpiece after the substrate 102 has been thinned. Openings 1022 can be formed though the substrate 102, the nucleation layer 122, and the buffer layer 124 to expose the channel layer 126. Doped regions 1024 can be formed within the openings 1022 or within the channel layer 126 under the openings. The doped regions 1024 may form diodes at the interface with the channel layer 126 or may allow for backside ohmic contacts to be made to the channel layer 126. The openings 1022 can be filled with an insulating layer 1026, and processing can continue as illustrated and described starting with FIG. 2. Clearly, subsequent patterning of the substrate 102 and formation of the insulating layers along the backside of the substrate 102 as described and illustrated in FIGS. 2 to 8 would not remove the doped regions 1024.

Figure 11:
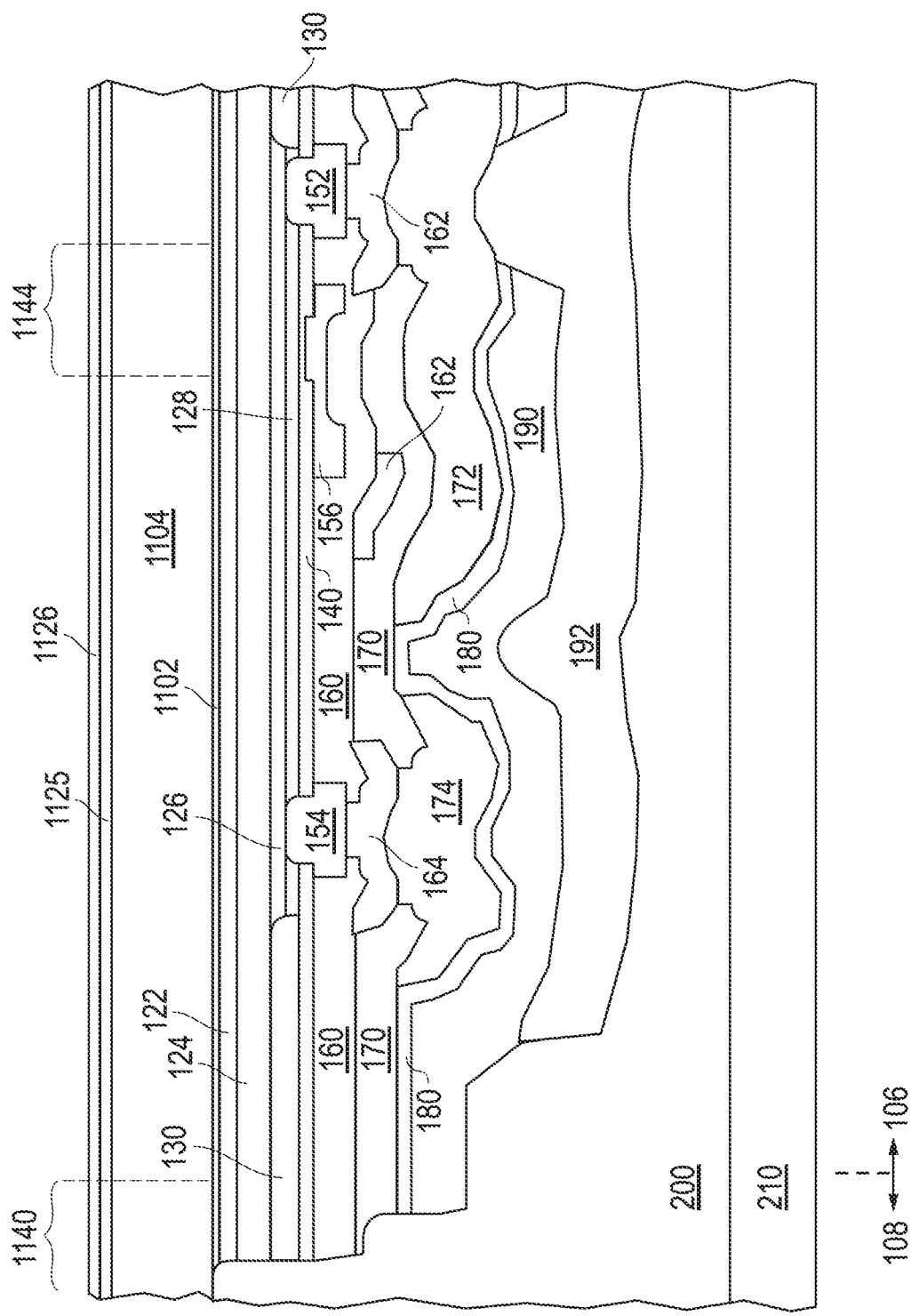
FIG. 11 includes an illustration of a cross-sectional view of a portion of a workpiece after forming regions along a backside of a substrate for a vertical bipolar transistor in accordance with a further alternative embodiment.

FIG. 11 includes an illustration of the workpiece after the substrate 102 has been thinned. Additional processing may be performed to further smooth the backside surface to reduce roughness along the backside surface. The substrate 102 can be processed to allow a vertical bipolar transistor to be formed. The substrate 102 may have heavily doped region 1102 and a lightly doped region 1104 when the layers 122, 124, and 126 are formed over the substrate 102. After thinning, a heavily doped region 126 may be formed along all of the backside surface of the substrate 102 or selectively formed only where the vertical bipolar transistor is being formed. Processing to remove portions of the substrate 102 and formation of the insulating layers along the backside of the substrate 102 can proceed as previously described. Subsequent patterning of the substrate 102 and formation of the insulating layer as illustrated in FIGS. 2 to 8, except that portions 1140 (mechanical support near the scribe lanes) and 1144 (for the vertical bipolar transistor) would not be removed.

Figure 12:
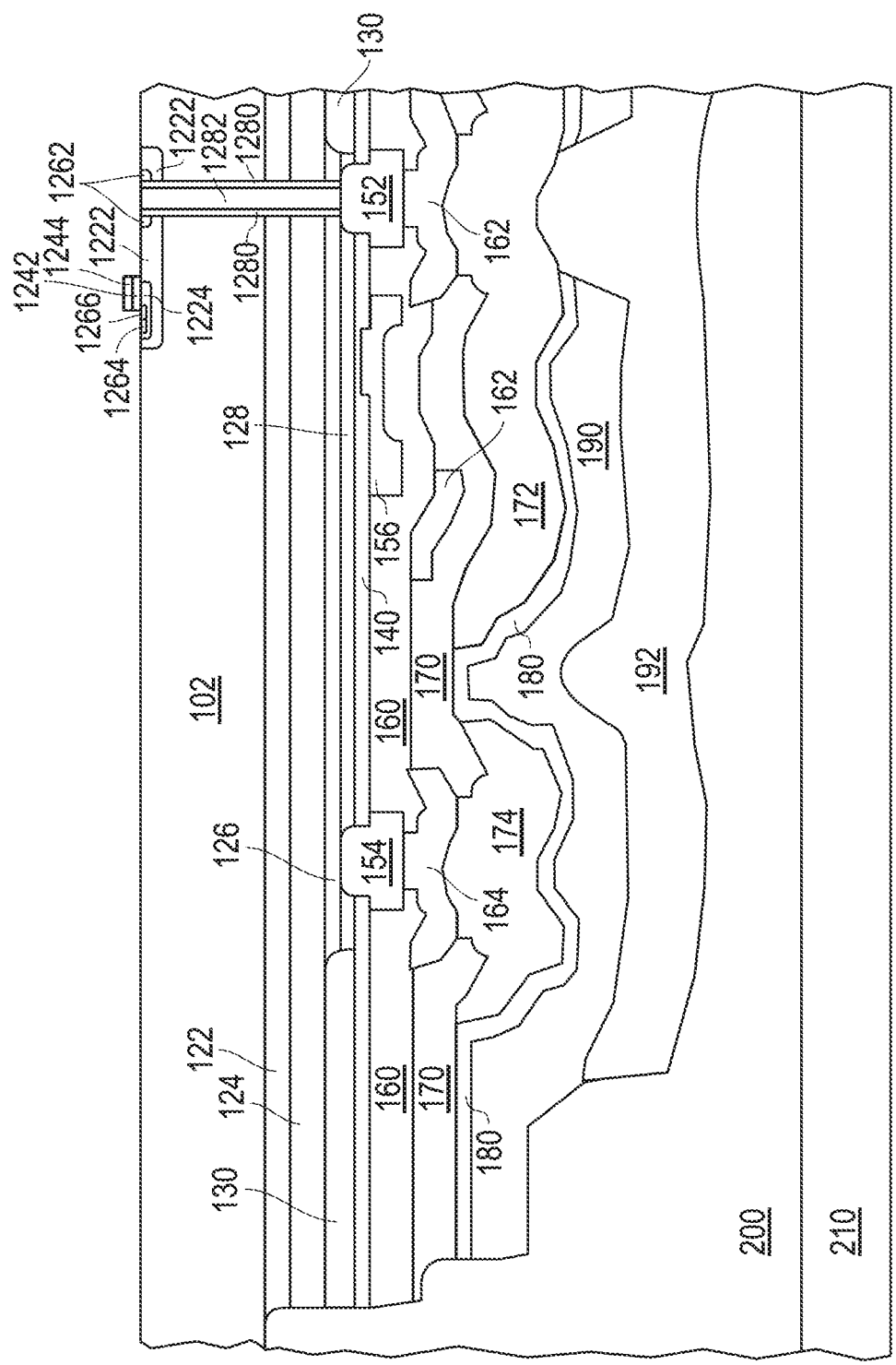
FIG. 12 includes an illustration of a cross-sectional view of a portion of a workpiece after forming transistor of a cascode circuit along a backside of a substrate in accordance with yet another alternative embodiment.

In another embodiment, a different electronic component or circuit may be formed along the backside of the workpiece. FIG. 12 includes an illustration of the workpiece after the substrate 102 has been thinned. Additional processing may be performed to further smooth the backside surface to reduce roughness along the backside surface. The substrate 102 can be processed to allow a switch transistor to be formed, where the combination of the switch transistor and HEMT form a cascode circuit. The substrate 102 can be doped to form a drift region 1222 and a body region 1224. The body region 1224 includes a channel region for the transistor. The regions 1222 and 1224 can have opposite conductivity types as compared to each other, and the drift region 1222 can have an opposite conductivity type as compared to the portion of the substrate 102 abutting the drift region 1222. A gate dielectric layer 1242 and a gate electrode 1244 are formed over portions of the regions 1222 and 1224.

Heavily doped regions 1262, 1264, and 1266 are formed. In the embodiment as illustrated, the heavily doped region 1262 is formed within the drift region and is a drain contact region for the transistor, the heavily doped region 1264 is a body contact region for the body region 1224, and the heavily doped region 1266 is a source region for the transistor. Portions of the heavily doped region 1262, the drift region 1222, the substrate 102, and layers 122, 124, and 126 are removed to define a trench extending to the source electrode 152 of the HEMT. An insulating layer 1280 is formed along the sidewall of the trench, and a conductive via 1282 is formed within the trench. Although not illustrated, a conductive strap can be used to electrically connect the heavily doped regions 1264 and 1266 to each other, and another conductive strap can be used to electrically connect the heavily doped region 1262 to the conductive via 1282. Thus, the drain contact region 1282 is electrically connected to the source electrode 152 of the HEMT.

Processing to remove portions of the substrate 102 and formation of the insulating layers along the backside of the substrate 102 can proceed as previously described. Subsequent patterning of the substrate 102 and formation of the insulating layer as illustrated in FIGS. 2 to 8, except that portions that include the backside transistor (and its corresponding conductive via) and mechanical support would not be removed. An electrical connection between the gate electrode 156 of the HEMT and the heavily doped (source) region 1266 of the backside transistor can be made when the die is packaged.

In a further embodiment, another circuit may be partly or completely formed within the substrate. For example, a gate driver or control circuit may be formed along the backside of the substrate 102. In another embodiment, a half bridge or full bridge circuit may be formed.

In still a further embodiment, all of the substrate 102 may be removed and the substrate 102 is replaced by the insulating layers 422 and 622. In yet another embodiment, portions of the substrate 102 may remain in the finished device, and such portions do not need to be immediately adjacent to the scribe lanes. The portions of the substrate 102 may remain within the component regions where the electrical field is relatively lower, such as near the source electrode 152 or between the source and gate electrodes 152 and 156.

Embodiments described herein can also help to reduce the likelihood of breakdown of a high voltage electronic component, such as a transistor, via the substrate, where the electronic component includes a semiconductor material having a relatively larger bandgap energy, and the substrate includes a different semiconductor material having a relatively smaller bandgap energy. The process allows relatively two sequence operation to remove significant portion of the substrate during the first sequence where the remaining portion of the substrate provides sufficient mechanical support, and remove another significant portion of the substrate during the second sequence where a fill material and, if any, the remaining portion of the substrate to provide sufficient mechanical support. The process can be selective in that not all of the substrate must be removed, such as would occur with a wafer-wafer bonding process. The process as described herein also can easier to implement, as the pressures and temperatures seen with wafer-wafer bonding are not required, and removal of the handle substrate (in wafer-wafer bonding) is obviated.

Backside processing allows more options to designers and fabricators of the electronic devices, as backside components and interconnects can be formed relatively later in the process when maximum thermal budgets may be limited due to frontside components may have already been formed. Still further, the selection of backside components may be deferred until later in the fabrication process. Thus, after the frontside components are formed, a decision can be made whether to form another component for a cascode circuit, a gate driver or control circuit, or a bridge (half or full) is to be formed.

Furthermore, voids formed within one or more of the insulating layers along the backside of the workpiece can help dissipate stress along the backside of the workpiece.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An electronic device comprising:
a first semiconductor material having a first bandgap energy;
a semiconductor layer overlying the first semiconductor material, wherein the semiconductor layer includes a second semiconductor material having a second bandgap energy that is greater than the first bandgap energy; and
a first electronic component within the semiconductor layer,
wherein:
the first electronic component includes a high electrical field region and a low electrical field region; and
within at least part of the high electrical field region, the first semiconductor material is not present under the first electronic component.

Embodiment 2

The electronic device of Embodiment 1, wherein the first semiconductor material is present around a peripheral region of the electronic device.

Embodiment 3

The electronic device of Embodiment 1, further comprising a second electronic component, wherein:
the semiconductor layer has first and second major surfaces that lie along opposite sides of the semiconductor layer;
the first electronic component lies along the first major surface of the semiconductor layer; and
the second electronic component is adjacent to the second major surface of the semiconductor layer.

Embodiment 4

The electronic device of Embodiment 1, further comprising an insulating layer, wherein:
the semiconductor layer has first and second major surfaces that lie along opposite sides of the semiconductor layer;
the first electronic component lies along the first major surface of the semiconductor layer; and
the insulating layer lies along the second major surface of the semiconductor layer.

Embodiment 5

A process of forming an electronic device having a component region and a periphery region, the process comprising:
providing a substrate and a semiconductor layer overlying the substrate;
forming a first electronic component within the semiconductor layer, wherein the first electronic component is within the component region;
removing a first portion of the substrate within the component region to define a first trench;
forming a first insulating layer within the first trench;
removing a second portion of the substrate within the component area adjacent to first insulating layer to define second trench; and
forming a second insulating layer within the second trench.

Embodiment 6

The process of Embodiment 5, wherein a void is formed within the first trench when forming the first insulating layer or within the second trench when forming the second insulating layer.

Embodiment 7

The process of Embodiment 5, wherein, in a finished device, a third portion of the substrate remains with the periphery region.

Embodiment 8

The process of Embodiment 5, wherein the substrate includes a substrate semiconductor material having a substrate bandgap energy, and the semiconductor layer has a semiconductor bandgap energy that is greater than the substrate bandgap energy.

Embodiment 9

The process of Embodiment 8, wherein in a finished device, none of the substrate semiconductor material remains within the electronic device.

Embodiment 10

The process of Embodiment 5, wherein the first electronic component includes a gate electrode and a drain electrode.

Embodiment 11

The process of Embodiment 10, wherein:
removing the first portion comprises removing the first portion of the substrate that underlies a portion of the first electronic component between the gate electrode and drain electrode;
removing the second portion comprises removing the second portion of the substrate that underlies the portion of the first electronic component between the gate electrode and drain electrode; or
removing the first portion and removing the second portion comprises removing different portion of the substrate that underlies the portion of the first electronic component between the gate electrode and drain electrode.

Embodiment 12

The process of Embodiment 5, further comprising reducing a thickness of the substrate before removing the first and second portions of the substrate.

Embodiment 13

The process of Embodiment 12, further comprising forming a second electronic component, wherein:

the semiconductor layer includes first and second major surfaces along opposite sides of the semiconductor layer;

forming the first electronic component comprises forming the first electronic component along the first major surface before removing the first portion of the substrate; and forming the second electronic component comprising forming the second electronic component adjacent to the second major surface after removing the first portion of the substrate.

Embodiment 14

The process of Embodiment 5, further comprising forming a planarized layer over the electronic component before removing the first and second portions of the substrate.

Embodiment 15

The process of Embodiment 5, wherein after removing the first portion of the substrate, a remaining portion of the substrate has an I-beam structure.

Embodiment 16

The process of Embodiment 5, further comprising forming an ohmic contact to the semiconductor layer after removing the first portion of the substrate.

Embodiment 17

The process of Embodiment 5, further comprising backgrinding the substrate to reduce a thickness of the substrate, wherein:
the substrate includes a Si substrate;
forming the first electronic component comprises forming a GaN HEMT along the first major surface of the substrate;
the process further comprises backgrinding the substrate before removing the first portion of the substrate, wherein after backgrinding, the substrate has first and second major surfaces along opposite sides of the substrate, wherein the second major surface of the semiconductor layer is closer to the first major surface of the substrate than to the second major surface of the substrate;
removing a first portion of the substrate to leave a remaining portion of the substrate that includes an I-beam structure; and
performing at least one action selected from a group consisting of:
  forming an ohmic contact to the semiconductor layer along the second major surface of the semiconductor layer;
  forming a second electronic component along the second major surface of the substrate or the semiconductor layer; and
  forming an interconnect along a second major surface of the semiconductor layer.

Embodiment 18

A process of forming an electronic device comprising:
providing a substrate and a semiconductor layer overlying the substrate, wherein the semiconductor layer has a first major surface and a second major surface opposite the first major surface;

forming a first electronic component along the first major surface of the semiconductor layer;
removing a portion of the substrate under the first electronic component; and
forming second electronic component adjacent to the semiconductor layer after removing the portion of the substrate.

Embodiment 19

The process of Embodiment 18, wherein forming the second electronic component comprises forming the second electronic component along the second major surface of the semiconductor layer.

Embodiment 20

The process of Embodiment 18, wherein forming the second electronic component comprises forming the second electronic component within the substrate after forming the first electronic component and after removing the portion of the substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any sub-combination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising a die, wherein the die comprises:
a frontside surface and a backside surface;
a high electron mobility transistor including a buffer layer, a channel layer, a barrier layer, and a gate electrode; and
an interconnect,
wherein:
the channel layer is disposed between the buffer layer and barrier layer, the barrier layer is disposed between the channel layer and the gate electrode, the frontside surface is closer to the gate electrode than to the channel layer, and the interconnect extends through the buffer layer and is electrically connected to the barrier layer.

2. The electronic device of claim 1, further comprising an insulating material adjacent to the backside of the die and underlying the channel layer between a drain electrode of the high mobility transistor and the gate electrode of the high electron mobility transistor.

3. The electronic device of claim 2, wherein the insulating material includes an oxide or an oxynitride.

4. The electronic device of claim 1, further comprising a substrate including a first semiconductor material disposed between the backside surface and the buffer layer, wherein:
the first semiconductor material has a first bandgap energy,
the buffer layer includes a second semiconductor material having a second bandgap energy that is greater than the first bandgap energy, and
the channel layer includes a third semiconductor material having a third bandgap energy that is greater than the first bandgap energy.

5. The electronic device of claim 1, wherein the high electron mobility transistor further comprises a source electrode and a drain electrode, wherein each of the source and drain electrodes contacts the barrier layer and is spaced apart from the buffer layer.

6. The electronic device of claim 1, wherein each of the buffer layer and the channel layer includes a III-V semiconductor material.

7. An electronic device comprising a die, wherein the die comprises:
a frontside surface and a backside surface;
a high electron mobility transistor including a buffer layer, a channel layer, a gate electrode, and
a doped region,
wherein:
the frontside surface of the die is closer to the gate electrode than to the channel layer, and
the doped region is within an opening and contacts the buffer layer, the channel layer, or the buffer and channel layers.

8. The electronic device of claim 7, wherein the opening extends to the backside of the die.

9. The electronic device of claim 8, wherein a diode includes a combination of the doped region and the channel layer.

10. The electronic device of claim 8, wherein the doped region allows a backside ohmic contact to be made to the channel layer.

11. The electronic device of claim 7, further comprising an insulating material adjacent to the backside of the die and underlying the channel layer between a drain electrode of the high mobility transistor and the gate electrode of the high electron mobility transistor.

12. The electronic device of claim 11, wherein the insulating material includes an oxide or an oxynitride.

13. An electronic device comprising a die, wherein the die comprises:
a frontside surface and a backside surface;
a high electron mobility transistor; and
an electronic component coupled to the high electron mobility transistor,
wherein:
the frontside surface is closer to the high electron mobility transistor than to the electronic component,
the backside surface is closer to the electronic component than to the high electron mobility transistor,
the electronic component including a portion of a substrate that includes a first semiconductor material having a first bandgap energy, and
the high electron mobility transistor includes a channel layer that includes a second semiconductor material having a second bandgap energy that is greater than the first bandgap energy.

14. The electronic device of claim 13, wherein the die further includes a conductive via extending through the substrate, wherein the conductive via lies along a conduction path between a terminal of the electronic component and an electrode of the high electron mobility transistor.

15. The electronic device of claim 13, wherein:
the electronic component is a switch transistor including a first current-carrying region,
the high electron mobility device includes a source electrode, and
the first current-carrying region is coupled to the source electrode of the high electron mobility transistor.

16. The electronic device of claim 15, wherein the switch transistor and high electron mobility transistor are parts of a cascode circuit.

17. The electronic device of claim 16, further comprising a conductive via, wherein:
the first current-carrying region of the switch transistor includes a drain contact region, and
the conductive via is electrically connected to the drain contact region of the switch transistor and the source electrode of the high electron mobility transistor.

18. The electronic device of claim 13, wherein the first semiconductor material includes monocrystalline Si, and the second semiconductor material includes a III-N compound.

19. The electronic device of claim 13, further comprising an insulating material adjacent to the backside of the die and underlying the channel layer between a drain electrode of the high mobility transistor and a gate electrode of the high electron mobility transistor.

20. The electronic device of claim 19, wherein the insulating material includes an oxide or an oxynitride.

* * * * *